United States Patent [19]
Miyajima

[11] Patent Number: 5,824,252
[45] Date of Patent: *Oct. 20, 1998

[54] METHOD OF RESIN MOLDING AND RESIN MOLDING MACHINE FOR THE SAME

[75] Inventor: Fumio Miyajima, Togura, Japan

[73] Assignee: Apic Yamada Corporation, Nagano, Japan

[ * ] Notice: The term of this patent shall not extend beyond the expiration date of Pat. No. 5,800,841.

[21] Appl. No.: 602,024

[22] Filed: Feb. 15, 1996

[30] Foreign Application Priority Data

Feb. 22, 1995 [JP] Japan ................................. 7-033493

[51] Int. Cl.⁶ ............................ B29C 33/68; B29C 45/02
[52] U.S. Cl. ...................... 264/272.17; 264/316; 425/89; 425/116; 425/544; 425/572; 425/588
[58] Field of Search .............................. 425/89, 544, 572, 425/588, 116, 117, 129.1; 264/272.17, 316; 249/115

[56] References Cited

U.S. PATENT DOCUMENTS

| | | | |
|---|---|---|---|
| 3,083,408 | 4/1963 | Bichl | 425/89 |
| 3,216,060 | 11/1965 | Trojanowski et al. | 425/89 |
| 4,442,056 | 4/1984 | Slepcevic | 264/272.17 |
| 4,872,825 | 10/1989 | Ross | 425/117 |
| 4,956,141 | 9/1990 | Allen et al. | 264/316 |
| 4,963,307 | 10/1990 | Sakai et al. | 264/272.17 |
| 5,151,276 | 9/1992 | Sato et al. | 264/272.17 |
| 5,478,517 | 12/1995 | Erdos | 264/272.17 |

FOREIGN PATENT DOCUMENTS

| | | | |
|---|---|---|---|
| 63-28042 | 2/1988 | Japan | 264/272.17 |
| 1-293523 | 11/1989 | Japan | 425/544 |
| 1-299008 | 12/1989 | Japan | 425/117 |

*Primary Examiner*—Robert Davis
*Attorney, Agent, or Firm*—Birch, Stewart, Kolasch & Birch, LLP

[57] ABSTRACT

A method and apparatus for resin molding upon an insert-member. The molding machine includes an upper die and a lower die, a cavity in at least one of the dies, a pot in which resin is introduced, and a resin path which allows the resin to flow from the pot into the cavity and onto the insert-member set in the dies. A film member is set between a parting face of the die and the insert-member. The film member covers a part of the insert-member corresponding to the resin path. An edge of the film member coincides with at least one of side edges of the cavity. The insert-member is clamped by the dies together with the film member when molding occurs.

20 Claims, 9 Drawing Sheets

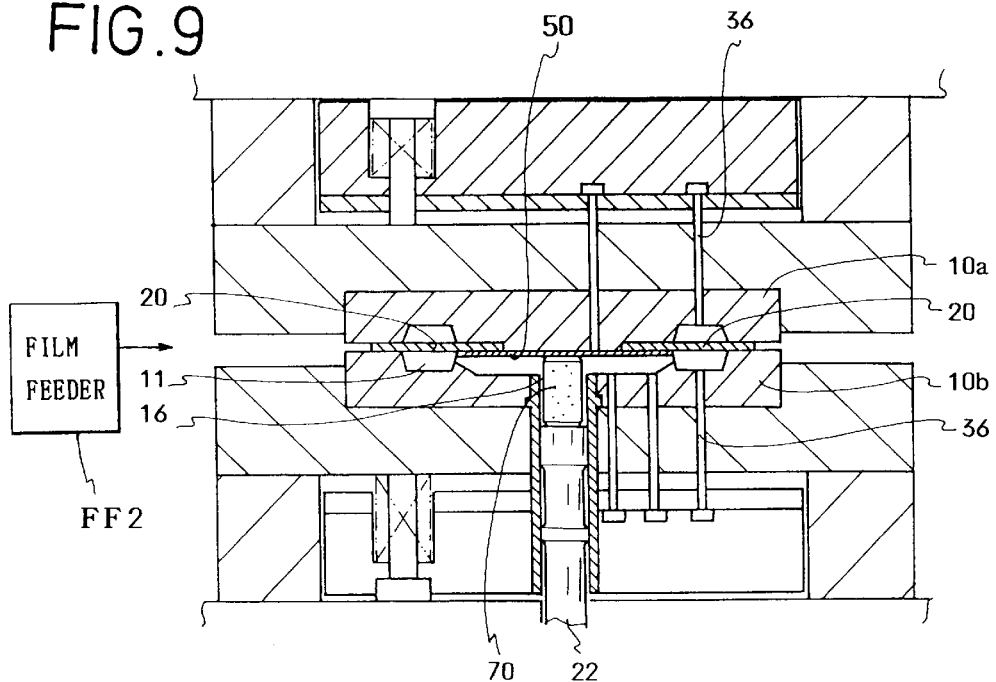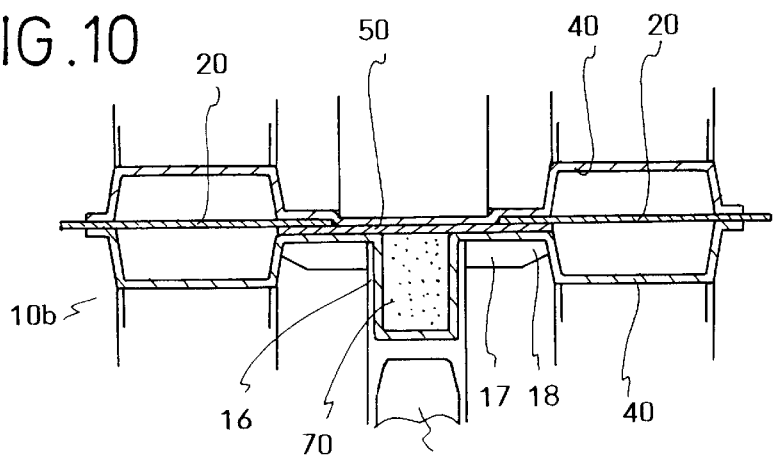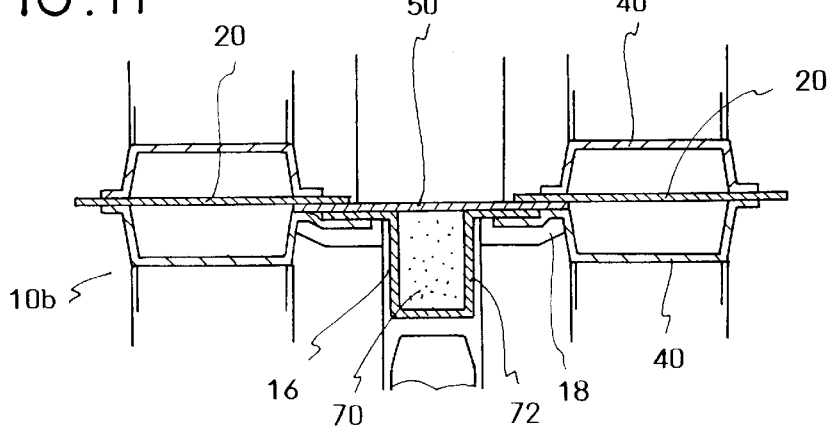

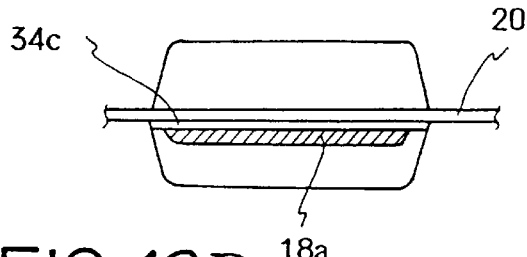
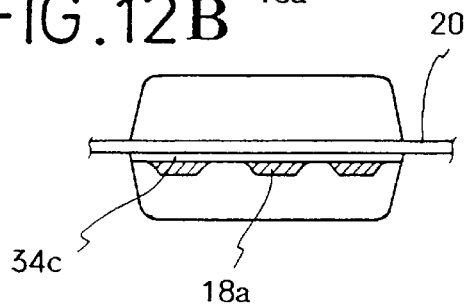
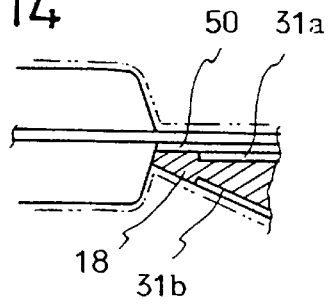
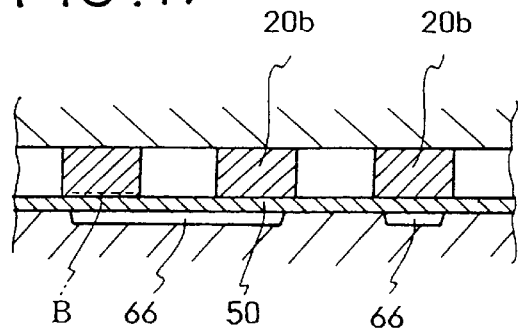
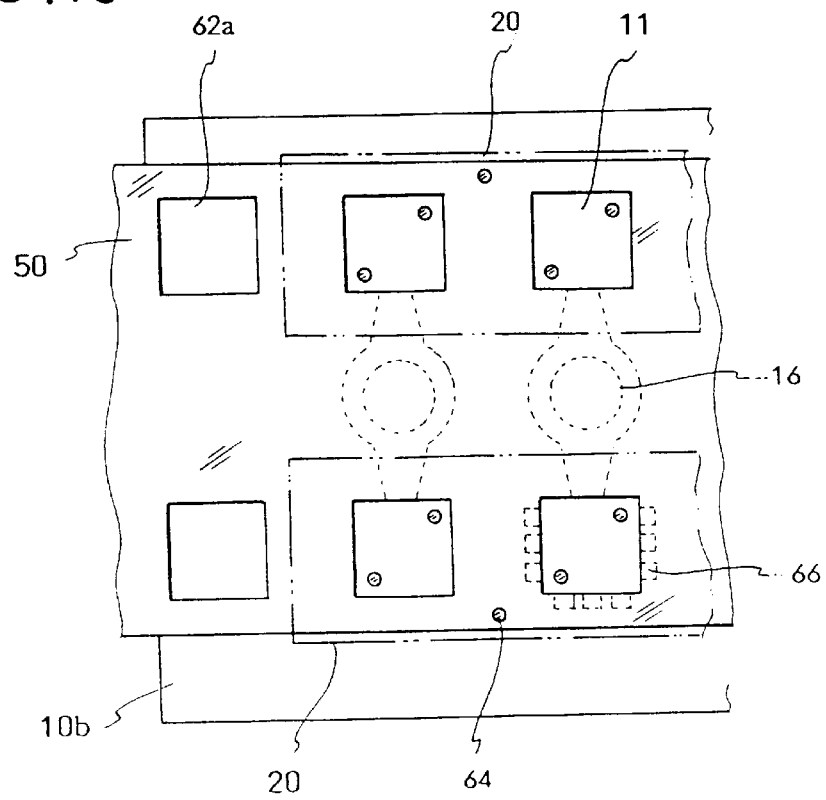

METHOD OF RESIN MOLDING AND RESIN MOLDING MACHINE FOR THE SAME

BACKGROUND OF THE INVENTION

The present invention relates to a method of resin molding and a resin molding machine for the same. In the present invention, a position of a gate of a resin path is improved to execute resin molding easier.

A conventional transfer molding machine for molding upon insert-members, e.g., lead frames, is shown in FIG. 23. In the conventional machine, the lead frames 3 are clamped by an upper die 2a and a lower die 2b. The lead frames 3 are molded upon by sending thermosetting resin from a pot 4 to cavities 5. Runners 6 and gates 7 of resin paths are connected with the cavities, and parts of the runners 6 and the gates 7 face to the lead frames 3, so the runners 6 and the gates 7 must be arranged so as not to interfere with outer leads of the lead frames 3. In the case of molding QFP in which outer leads are extended from four sides of a package section, the gates 7 are connected to one corner of each cavity 5 to avoid interference with the outer leads.

These days, lead frames having a large number of fine leads are required, so spaces for extending outer leads should be designed as wide as possible. As the result of this design, a space for providing the gate is limited, so that it has been difficult to design and manufacture the molding dies.

Further, by limiting the width of the gate, velocity of melted resin for filling the cavities should be faster so as to make molding efficiency higher. With this fast resin flow, air is apt to be involved in the resin melt, so that voids will be formed in molded products. If voids exist in the products, their quality and reliability must be lower.

SUMMARY OF THE INVENTION

The present invention has been invented to solve the above described problems. An object of the present invention is to provide a method of resin molding and a resin molding machine for the method in which a position of a gate can be freely designed so as to solve the problem based on the limitation of the position of the gate and so as to increase the molding efficiency and the reliability of molded products.

To achieve the objects, the method invention is:
a method of molding upon an insert-member in a resin molding machine, the resin molding machine including an upper die and a lower die, a cavity in at least one of said upper die and said lower die, a pot in which resin is introduced, and a resin path which allows the resin to flow from said pot into said cavity and onto said insert-member set in said dies,
the method comprising the steps of:
setting a film member between a parting face of the die, in which the resin path is formed, and the insert-member so as to cover a part of the insert-member corresponding to the resin path, wherein an edge of the film member coincides with at least one of side edges of the cavity;
clamping the insert-member by the dies together with the film member; and
filling the resin into the cavity via the resin path.

In the method, resin paths connecting the pot with the cavity may be formed in the upper die and the lower die.

In the method, the resin supplied in the pot may be tightly wrapped with wrapping film, an edge of the wrapping film may be extended from the pot to at least one of the side edges of the cavity, and the extended part of the wrapping film may be provided between the parting face and the insert-member to act as the film member.

In the method, the film member may be gate film, which covers over an opening section of the pot and which is extended until at least one of the side edges of the cavity.

In the method, an inner face of the cavity may be covered with release film, which is fixed on the inner face thereof by air suction. In this case, a molded product can be ejected easily.

On the other hand, the machine invention is:
a resin molding machine, comprising:
an upper die and a lower die for clamping an insert-member to be molded upon, the dies having a pot, a resin path and a cavity, wherein resin in the pot is introduced into the cavity via the resin path, and the resin flows upon the insert-member set in the dies; and
a film feeder for feeding a film member between a parting face of the die, in which the resin path is formed, and the insert-member so as to cover a part of the insert-member corresponding to the resin path, the film feeder positioning an edge of the film member to coincide with at least one of side edges of the cavity,
wherein an end of a gate of the resin path is connected with the at least one side edge of the cavity.

The molding machine may further comprise a resin supplier for supplying the resin, the resin being tightly wrapped with wrapping film, wherein an edge of the wrapping film may be extended from the pot to at least one of the side edges of the cavity.

In the resin molding machine, a plurality of the resin paths may be connected with the cavity. And a width of an end of the resin path connecting to the cavity may be equal to a length of the side edge of the cavity.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Embodiments of the present invention will now be described by way of examples and with reference to the accompanying drawings, in which:

FIG. 9 is a sectional view of the molding machine in which ordinary resin is used;

FIG. 10 is a sectional view of the molding machine in which the ordinary resin is used;

FIG. 11 is a sectional view of the molding machine in which the ordinary resin is used;

FIG. 12A is a side view of a semiconductor device, which is molded by the molding machine of a Third Embodiment;

FIG. 12B is a side view of the semiconductor device, which is molded by the molding machine of the Third Embodiment;

FIG. 14 is a partial sectional view showing an arrangement of the wrapping film in the vicinity of the gate;

FIG. 16 is a plan view of a Sixth Embodiment in which wide gate film is used;

FIG. 17 is a partial sectional view in the vicinity of air vents in the Sixth Embodiment;

DETAILED DESCRIPTION OF THE PREFERRED EMBODIMENTS

Preferred embodiments of the present invention will now be described in detail with reference to the accompanying drawings.

FIRST EMBODIMENT

Figure 1:
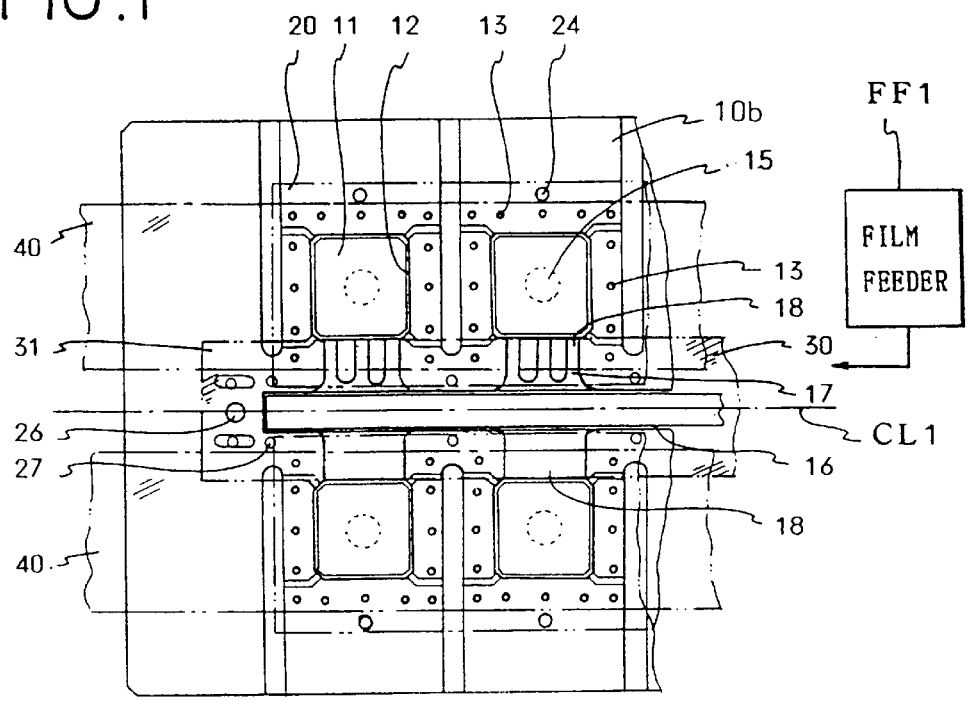
FIG. 1 is a plan view of a lower die of a resin molding machine of a First Embodiment on which wrapped resin, release film, etc. are set.
Figure 2:
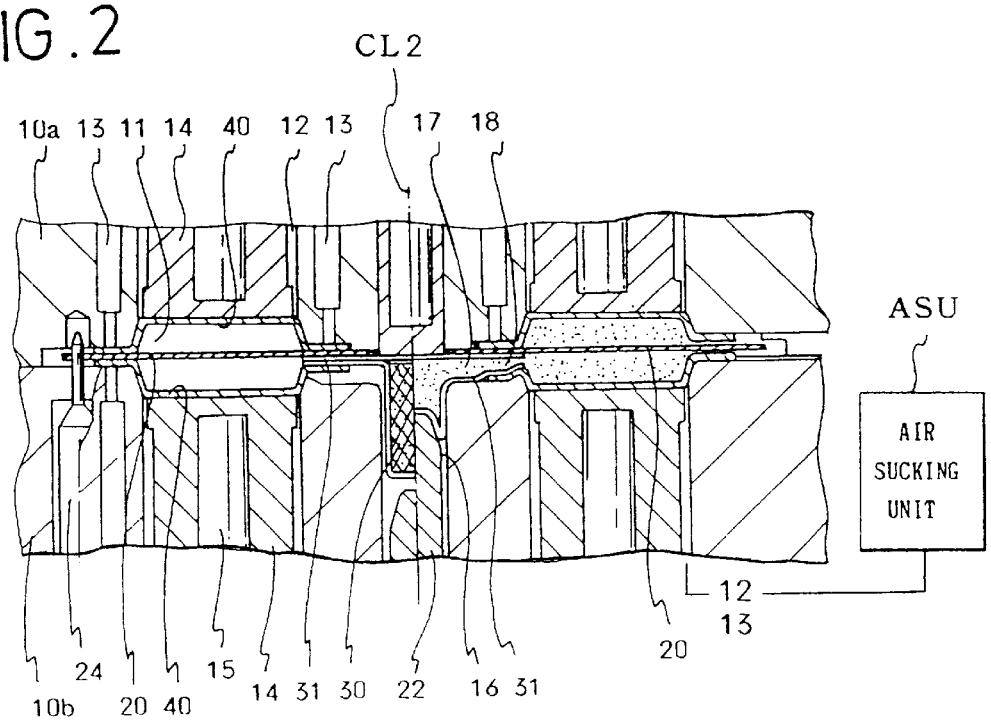
FIG. 2 is a sectional view of a main part of the resin molding machine of the First Embodiment.

A resin molding machine of the First Embodiment is shown in FIGS. 1 and 2. In the molding machine, release film is used for resin molding. FIG. 1 shows a plan view of a lower die 10b on which lead frames 20, which are insert-members to be molded, wrapped resin 30 and the release film 40 are arranged. FIG. 2 shows a state of clamping the lead frames 20 by an upper die 10a and the lower die 10b to mold.

Firstly, a method of resin molding with the release film 40 will be explained with reference to FIGS. 1 and 2.

In FIG. 2, the left side of a center line Cl2 shows a state of clamping the lead frame 20; the right side of the center line CL2 shows a state of filling resin in a cavity. In FIG. 2, the release film 40 is fixed on and along an inner face of each cavity 11 of the upper die 10a and the lower die 10b. The release film 40 is fixed in each cavity 11 by air suction through a sucking hole 12, which is opened in each cavity 11.

As shown in FIG. 1, the sucking holes 12 are opened along four side edges of an inner bottom face of the cavity 11 like a rectangular slit. Further, sucking holes 13 are opened in parting faces or clamping faces of the dies 10a and 10b, and they are arranged around the cavities 11. The sucking holes 12 and 13 are communicated with an air sucking unit ASU. When the release film 40 is set on the dies 10a and 10b, the release film 40 is firstly fixed on the clamping faces of the dies 10a and 10b by air suction through the sucking holes 13, then the release film 40 is fixed on and along the inner faces of the cavities 11 by air suction through the sucking holes 12.

Since the release film 40 covers molding sections in the dies 10a and 10b, the release film 40 can prevent the resin directly contacting the dies 10a and 10b while molding. The release film 40 is required: to resist a molding temperature of the dies 10a and 10b; to easily peel off from the resin when solidified; and to have enough flexibility so as to fit on the inner faces of the cavities 11. Thus, FEP sheet film, PET sheet film, EEPT sheet film, glass cloth in which fluoric resin is impregnated, polyvinylidene chloride, etc. can be employed as the release film 40 and the film member of the present invention. In the present embodiment, the thickness of the release film 40 is designed 35–50 $\mu$m.

The cavities 11 are formed by fitting cavity pieces 14 in base sections of the dies 10a and 10b. There is formed a gap between outer side faces of the cavity piece 14 and inner side faces of a base-hole of the base section in which the cavity piece 14 is inserted to form the cavity 11; the gap acts as the sucking hole 12. The sucking holes 13 are through-holes bored in the base sections.

In the method of resin molding with the release film 40, materials having high heat conductivity, e.g., copper, aluminum, which could not be used for molding dies of conventional molding machines, can be employed as the material of the cavity pieces 14. And heaters 15 are provided in the cavity pieces 14 so as to directly heat the cavity pieces 14. With this structure, heat exchange between the resin and the dies 10a and 10b can be accelerated, and the resin can be solidified in a shorter time.

By using the release film 40, no resin directly contacts the molding sections of the dies 10a and 10b, so that molded products can be easily peeled off from the molding dies 10a and 10b. Therefore, no ejector pins are needed in the dies 10a and 10b, so that the structure of the molding dies 10a and 10b can be quite simpler.

In the present embodiment, the wrapped resin 30 is tightly wrapped with wrapping film 31, so no resin directly contacts the dies 10a and 10b and the lead frames 20 even in resin paths (pot 16, runners 17 and gates 18). Note that, the resin 30 is formed by extruding resin melt. Since the resin 30 is formed by this manner, the extruded resin 30 includes less air and moisture than ordinary resin formed by packing resin powders, so the quality of molded products can be improved.

As shown in FIG. 1, the pot 16 in the lower die 10b is formed into a long pot, and the cavities 11 are arranged on both sides of the long pot 16. The wrapped resin 30 is formed into a long stick shape corresponding to the shape of the long pot 16. In the wrapped resin 30, the resin is tightly wrapped between two sheets of wrapping film 31. When the wrapped resin 30 is set in the pot 16, the wrapping film 31 is extended sideward from the pot 16, and side edges of the wrapping film 31 are overlapped with the side edges of the release film 40. In the present embodiment, the wrapping film 31 is designed that the side edges of the wrapping film 31 coincide with a side edge of each cavity 11, which is the closest edge to the pot 16, when the wrapped resin 30 is set in the pot 16.

Figure 3A:
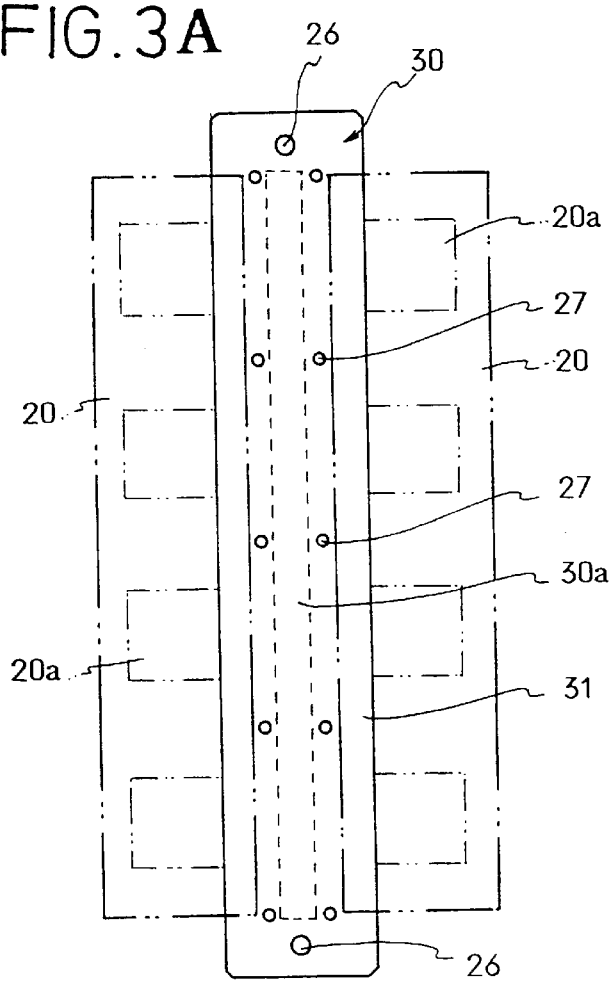
FIG. 3A is a plan view showing an arrangement of lead films and the release film.

FIG. 3A shows a planar arrangement of the lead frames 20 and the wrapped resin 30 in the lower die 10b. The side edges of the wrapping film 31 of the wrapped resin 30 are coincided with side edges of mold-sections 20a of the lead frames 20. The side edges of mold-sections 20a are located on the side edges of the cavities 11. The cavities 11 are separated away from the pot 16 by a prescribed distance, and the side edges of the cavities 11 are parallel to the pot 16. Thus, the wrapping film 31 may be formed into a strip having fixed width, which is based on the distance between the pot 16 and the cavities 11.

Figure 3B:
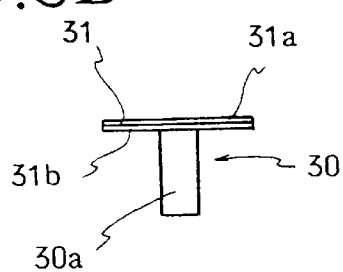
FIG. 3B is a front view of the wrapped resin.

FIG. 3B is a front view of the wrapped resin 30. The wrapped resin 30 has a T-shape in front. Lower wrapping film 31b has a pocket section 30a in which the resin is accommodated. Upper wrapping film 31a tightly seals the resin with the lower wrapping film 31b. The side sections of the upper wrapping film 31a and the lower wrapping film 31b are sealed, but they are mutually peeled off by pressurized resin in the resin paths. The runners 17 and the gates 18 (see FIG. 2) allow resin to flow from the pot 16 to the cavities 11 via the resin paths whose inner faces are covered with the wrapping film 31.

Next, actual steps of resin molding of the First Embodiment will be explained. Firstly, two sheets of the release film 40 are drawn so as to cover the parting faces of the dies 10a and 10b, which have been opened. Then the release film 40 is fixed on and along the inner faces of the cavities 11 of each die 10a and 10b by air suction. The wrapped resin 30 is supplied into the pot 16 by a film feeder FF1, then the lead frames 20 are set on the lower die 10b. The lead frames 20 are clamped by the upper die 10a and the lower die 10b together with the release film 40. The resin melt in the pot 16 is pressurized by a plunger 22 and filled into the cavities 11 to mold the lead frames 20.

Since the side edges of the wrapping film 31 of the wrapped resin 30 are extended to the side edges of the cavities 11, the inner faces of the runners 17 and the gates 18 are covered with the upper wrapping film 31a and the lower wrapping film 31b, and the mold-sections 20a of the lead frames 20 can be molded without sticking the resin onto other parts thereof. Namely, the method of the present embodiment is capable of freely arranging the runners 17 and the gates 18 without reference to arrangement of outer leads in the lead frames 20.

In FIG. 1, the upper side of a center line CL1 shows an example in which three runners 17 and gates 18 connect the pot 16 with each cavity 11; the lower side of the center line CL1 shows an example in which one runner 17 and gate 18, whose width is almost equal to the length of the side edge of the cavity 11, connect the pot 16 with each cavity 11. By molding the lead frames 20 with the wrapped resin 30, the gate 18 or the gates 18 can be connected with the cavity 11 at any optional positions.

When the wrapped resin 30 is set into the pot 16, the wrapped resin 30 must be correctly positioned so as to precisely position the wrapping film 31 on the lead frames 20. In the present embodiment, there are provided guide pins 24 for positioning the lead frames 20 in the lower die 10b, and there are provided pilot pins 26 for positioning the wrapped resin 30 in the lower die 10b. The wrapped resin 30 can be correctly positioned by fitting the pilot pins 26 into pilot holes of the wrapping film 31. Note that, if a gap between an inner face of the pot 16 and the wrapped resin 30 is designed quite small, e.g., 0.1 mm, the wrapped resin 30 can be correctly positioned without the pilot pins 26 and the pilot holes. In this case, the heat exchange between the wrapped resin 30 and the die 10b can be accelerated.

Since the wrapped resin 30 is formed into the long stick shape as shown in FIG. 3A, the pilot pins 26 are arranged to correspond to both end sections of the long wrapped resin 30. Further, there are arranged sub-pilot pins 27 on both sides of the pot 16 at regular intervals, and there are bored sub-pilot holes into which the sub-pilot pins 27 can fit in the wrapping film 31 so as to precisely position the wrapped resin 30.

Figure 4A:
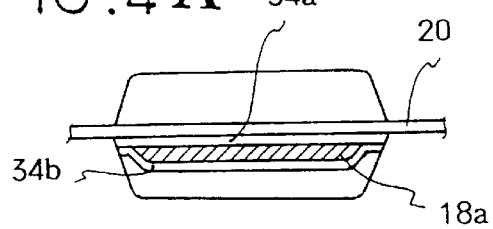
FIG. 4A is a side view of a semiconductor device, which is molded by the molding machine of the First Embodiment.
Figure 4B:
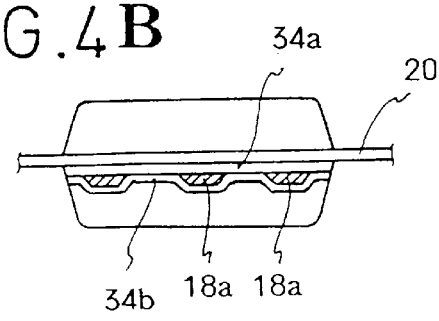
FIG. 4B is a side view of a semiconductor device, which is molded by the molding machine of the First Embodiment.

FIGS. 4A and 4B show side views of semiconductor devices, which are manufactured by the resin molding machine of the First Embodiment. A gate mark or marks 18a, which are traces of the gates 18, are formed on side faces of the semiconductor devices. In the present embodiment, the gates 18 are connected to the side edges of the cavities 11, so the gate marks 18a are formed at the positions corresponding to the side edges of the cavities 11. FIG. 4A shows an example of having the wide gate 18 whose width is almost equal to the length of the side edge of the cavity 11, so the gate mark 18a is like a line. On the other hand, FIG. 4B shows an example of having three gates 18 connected with one cavity 11, so three short gate marks 18a are formed.

Figure 5:
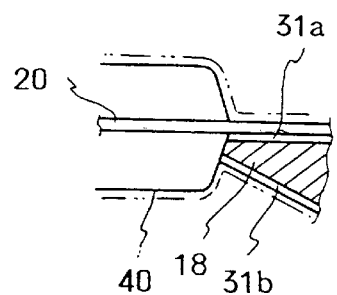
FIG. 5 is a partial sectional view showing an arrangement of wrapping film in the vicinity of a gate.

FIG. 5 shows a sectional view in the vicinity of the cavity and the gate 18. Edges of the upper wrapping film 31a and the lower wrapping film 31b reach an inner end of the gate 18 at which the gate 18 is connected to the cavity. Therefore, end marks 34a and 34b of the upper wrapping film 31a and the lower wrapping film 31b, which enclose the gate marks 18a, are formed on the side faces of the semiconductor devices as shown in FIGS. 4A and 4B.

SECOND EMBODIMENT

Figure 6:
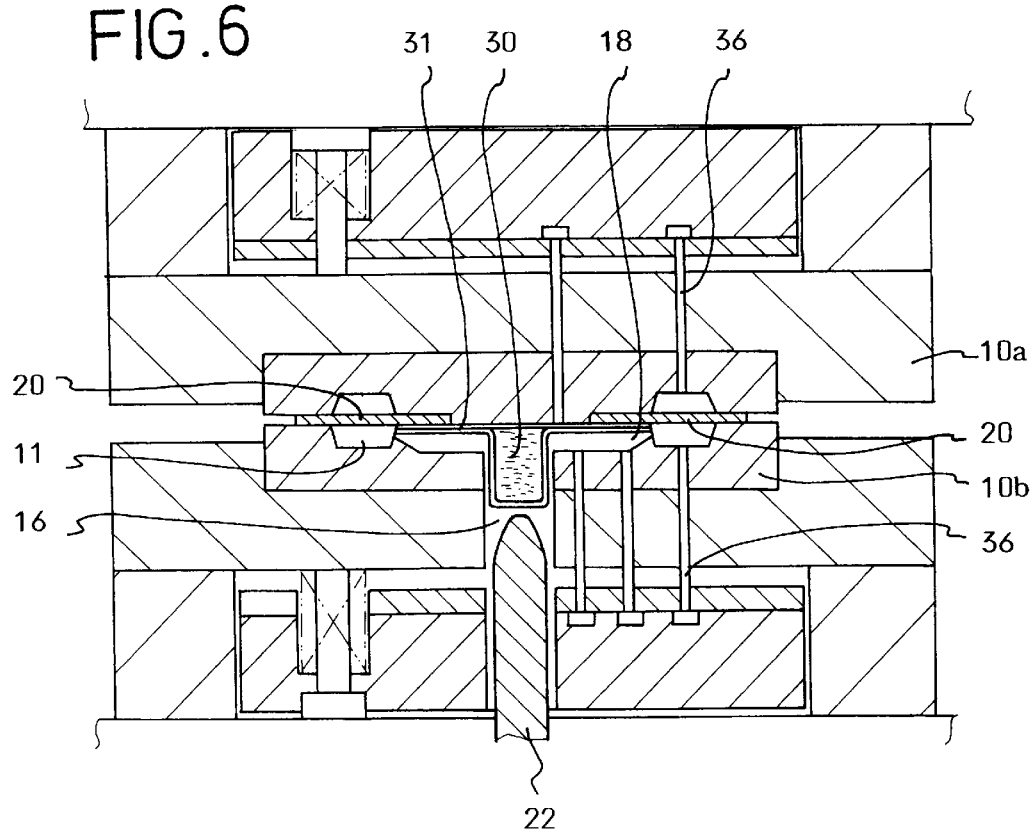
FIG. 6 is a sectional view of the molding machine of a Second Embodiment.

In the First Embodiment, the release film 40 is used, but no release film is used in the present embodiment as shown in FIG. 6. In the resin molding machine shown in FIG. 6, the wrapped resin 30 is set in the pot 16; other structures are almost equal to the conventional transfer molding machine. As in the First Embodiment, the wrapping film 31 of the wrapped resin 30 is designed so that the side edges of the wrapping film 31 coincide with the side edge of each cavity 11, which is the closest edge to the pot 16, when the wrapped resin 30 is set in the pot 16.

Figure 7:
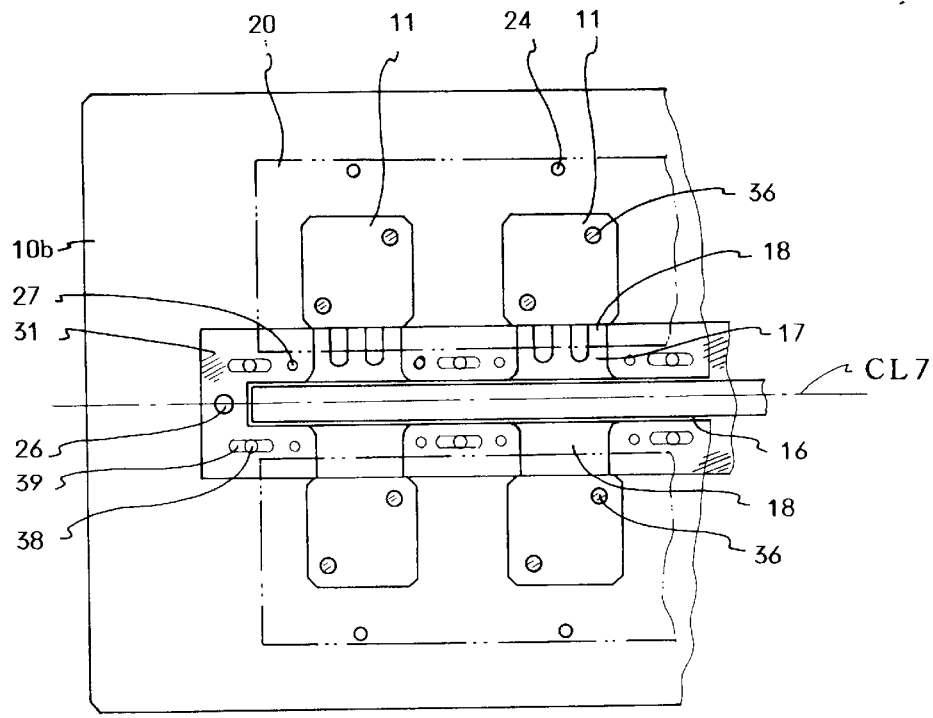
FIG. 7 is a plan view showing an arrangement of the wrapped resin, etc. on the lower die of the Second Embodiment.

A planar arrangement of the pot 16, the cavities 11, the wrapped resin 30 and the lead frames 20 in the lower die 10b of the Second Embodiment is shown in FIG. 7. The relationship among the wrapping film 31 and the cavities 11 is equal to that of the First Embodiment. In FIG. 7, the upper side of a center line CL7 shows an example in which three gates 18 connect the pot 16 with each cavity 11; the lower side of the center line CL7 shows an example in which one gate 18, whose width is almost equal to the length of the side edge of the cavity 11, connects the pot 16 with each cavity 11.

As in the First Embodiment, the wrapping film 31 is extended from the pot 16 to the ends of the gates 18 at which the gates 18 are connected to the cavities 11, so that the runners 17 and the gates 18 can be optionally arranged between the pot 16 and the cavities 11. Note that, in the present embodiment, since the resin directly contacts the inner faces of the cavities 11, ejector pins 36 are provided to the cavities 11 so as to eject molded products therefrom.

Figure 8:
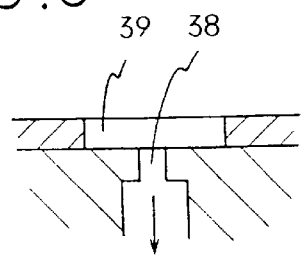
FIG. 8 is a partial sectional view showing a sucking hole.

To precisely set the wrapped resin 30 in the lower die 10b, there are provided the pilot pins 26 and the sub pilot pins 27 in the lower die 10b, further there are opened sucking holes 38 for fixing the wrapping film 31 by air suction in the lower die 10b. The sucking holes 38 suck the side edges of the wrapping film 31 so as to prevent said side edges from turning over when the wrapped resin 30 is set into the pot 16. As shown in FIG. 8, an upper end of the sucking hole 38 is opened in an inner bottom face of a groove 39 so as to effectively suck the wrapping film 31. Note that, the sucking holes 38, of course, can be applied to the First Embodiment.

Semiconductor devices can be manufactured as in the devices shown in FIGS. 4A and 4B.

THIRD EMBODIMENT

In the First and the Second Embodiments, the wrapped resin 30 is used, but an ordinary resin tablet, which is made by forming resin powders into a columnar shape, is used in the Third Embodiment.

As shown in FIG. 9, an ordinary resin tablet 70 is used in the molding machine. In this case, no release film is used. To optionally arrange the runners 17 and the gates 18, side edges of gate film 50 are coincided with the side edge of the cavities 11 by a film feeder FF2. Since no release film is used, the ejector pins 36 for ejecting the molded products are required.

Examples shown in FIGS. 10 and 11 show a method using the ordinary resin tablet 70 and the release film 40.

In FIG. 10, the cavities, the runners 17, the gates 18 and the pot 16 are covered with a sheet of the release film 40. On the other hand, in FIG. 11, the release film covers the cavities and the gates 18, etc.; pot film 72, which is another film member, covers an inner face of the pot 16. The pot film 72 has a pocket section in which the resin tablet 70 is accommodated.

In FIGS. 10 and 11, the gate film 50 is provided to correspond to the side edges of each cavity, so that the gates 18 can be connected to any optional positions in the side edge thereof.

In the molding machine shown in FIG. 10, firstly the release film 40 is set on the lower die 10b, then the resin tablet 70 is set into the pot 16 together with the release film 40. Next, the gate film 50 is set, and the lead frames 20 are set to mold.

On the other hand, in the molding machine shown in FIG. 11, firstly the release film 40 and the pot film 72 are set on the lower die 10b, then the resin tablet 70 is set into the pot 16 together with the pot film 72.

FIGS. 12A and 12B show side views of the semiconductor devices, which are manufactured by the resin molding machine of the present embodiment. As well as the examples shown in FIGS. 4A and 4B, the gate mark or marks 18a are formed on side faces of the semiconductor devices. FIG. 12A shows the example of having the wide gate 18 whose width is almost equal to the length of the side edge of the cavity 11; FIG. 12B shows the example of having three gates 18 connected with one cavity 11. In the present embodiment, the gate film 50 covers the lead frames 20, thus end marks 34c of the gate film 50 are formed on the side faces of the semiconductor devices.

FOURTH EMBODIMENT

Figure 13A:
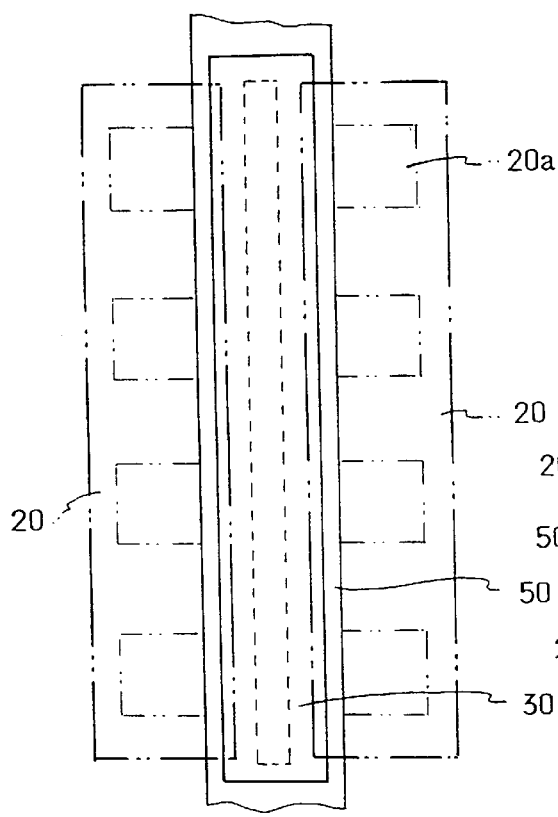
FIG. 13A is a plan view showing an arrangement of the wrapped resin, etc. on the lower die of a Fourth Embodiment.
Figure 13B:
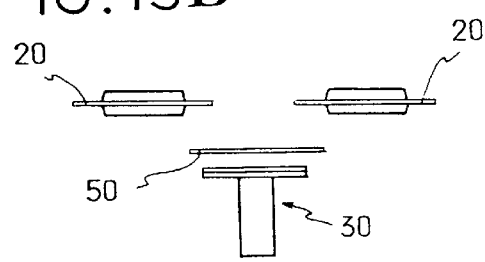
FIG. 13B is a front view showing an arrangement of the wrapped resin, etc. on the lower die of the Fourth Embodiment.

FIGS. 13A and 13B show the Fourth Embodiment using the wrapped resin 30 and the gate film 50. In the present embodiment, the side edges of the wrapping film 31 of the wrapped resin 30 is not required to precisely coincide with the side edges of the cavities.

In the Fourth Embodiment, the width of the gate film 50 is designed on the basis of the positions of the side edges of the cavities 11. The gate film 50 is drawn so as to set on the parting face of the lower die 10b after the wrapped resin 30 is set in the pot 16. The position of the gate film 50 is defined with respect to the lead frames 20 and the lower die 10b, so it is not required to precisely position the wrapping film 31. With this structure, the wrapped resin 30 can be commonly used even in the case of molding different products.

The resin molding method with the gate film 50 can be applied to the case of using the release film 40 and the case of using no release film 40.

A sectional view in the vicinity of the end of the gate 18 is shown in FIG. 14. The side edge of the gate film 50 is extended until the side edge of the cavity. With this structure, external appearance of the semiconductor devices manufactured by the present method will be similar to the examples shown in FIGS. 12A and 12B.

FIFTH EMBODIMENT

Figure 15A:
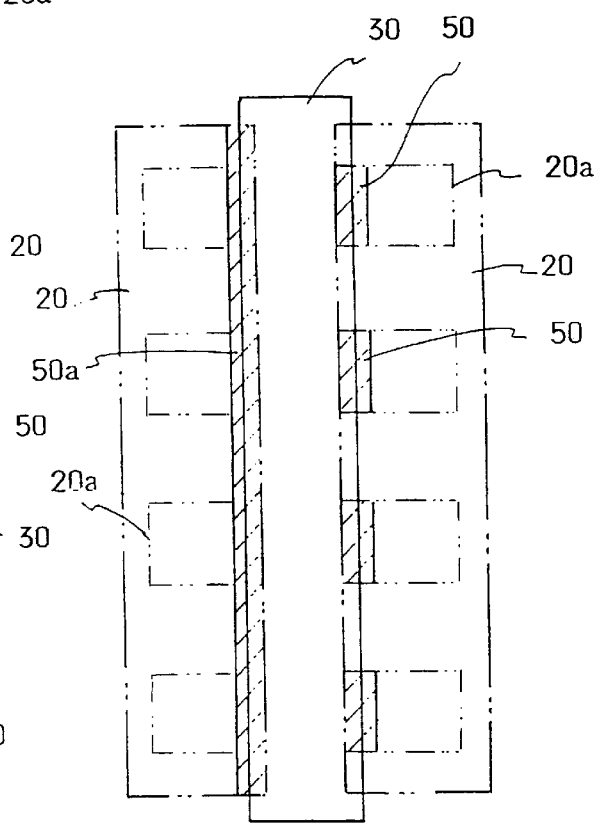
FIG. 15A is a plan view showing an arrangement of the lead frames on which gate film is stuck and the wrapped resin in a Fifth Embodiment.
Figure 15B:
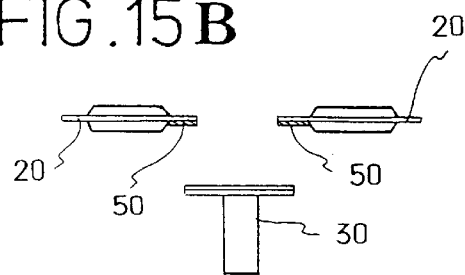
FIG. 15B is a front view showing an arrangement of the lead frames on which gate film is stuck and the wrapped resin in the Fifth Embodiment.

In the Fifth Embodiment, a plurality of pieces of the gate film 50 are previously stuck on the lead frames 20 as shown in FIGS. 15A and 15B.

The gate film 50 is stuck at a position in the lead frame 20 corresponding to each combination of the runner 17 and the gate 18. The lead frames 20 on which the gate film 18 has been stuck are set on the die to mold. The gate film 18 is stuck along at least one side edge of each mold-section 20a (see FIG. 15A). The gate film 50a is stuck along the inner edge of the lead frame 20, wherein an outer side edge of the gate film 50a coincides with the side edges of all mold-sections 20a. (see FIG. 15A).

When the lead frames 20 are molded, the lead frames 20 are set to make the gate film 50 contact the wrapped resin 30. In this case, it is not required to coincide the wrapped resin 30 with the side edges of the mold-sections 20a of the lead frames 20.

The lead frames 20 on which the gate film 50 is stuck can be applied to the molding method in which the release film 40 is used and the method in which the release film 40 is not used.

SIXTH EMBODIMENT

In the Fifth Embodiment, the gate film 50 covers the resin path connecting the pot 16 and the cavity 11. In the Sixth Embodiment, wide gate film 50, which is capable of covering almost all surfaces of the lead frames 20, is used (see FIG. 16).

In the case of using the wide gate film 50, resin holes 62a are bored in the gate film 50. The resin holes 62a are arranged to correspond to the cavities 11. The gate film 50 is correctly positioned on the lower die 10b by positioning pins 64. Note that, there are formed air vents 66 in the lower die 10b.

In the present embodiment too, the runners 17 and the gates 18 can be optionally arranged to connect side edges of the cavities 11 at any positions. Especially, in the present embodiment, one or more gates 18 can be connected to all side edges of each cavity 11 because inner edges of the resin hole 62a of the gate film 50 are arranged to coincide with four edges of the cavity 11. Namely, the resin paths connecting the pot 16 to the cavities 11 can be designed optionally.

As well as the wide gate film 50, wide wrapping film 31 of the wrapped resin 30 may be used. In this case, the extended sections of the wrapping film 31 are capable of covering almost all surfaces of the lead frames 20, and the resin holes 62a are bored in the extended sections.

Figure 18:
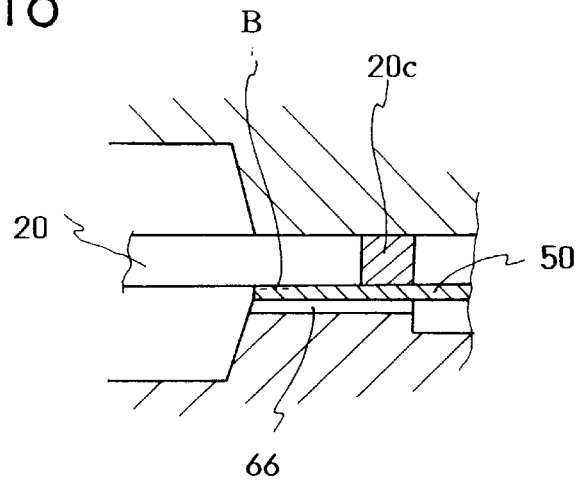
FIG. 18 is a partial sectional view in the vicinity of the air vents in the Sixth Embodiment.

FIGS. 17 and 18 show the air vents 66. In FIG. 17, symbols 20b are leads of the lead frame 20; in FIG. 18, symbol 20c is a tie bar of the lead frame 20. The air vent 66 may correspond to one or a plurality of the air vents 66 as shown in FIG. 17. If the gate film 50 is made of relatively tough material, the resin melt can be prevented to invade into a part B in which the gate film 50 contacts the lead frame 20 by clamping the lead frame 20 together with the gate film 50, so that molding can be executed without sticking the resin onto the lead frame 20.

SEVENTH EMBODIMENT

Figure 19:
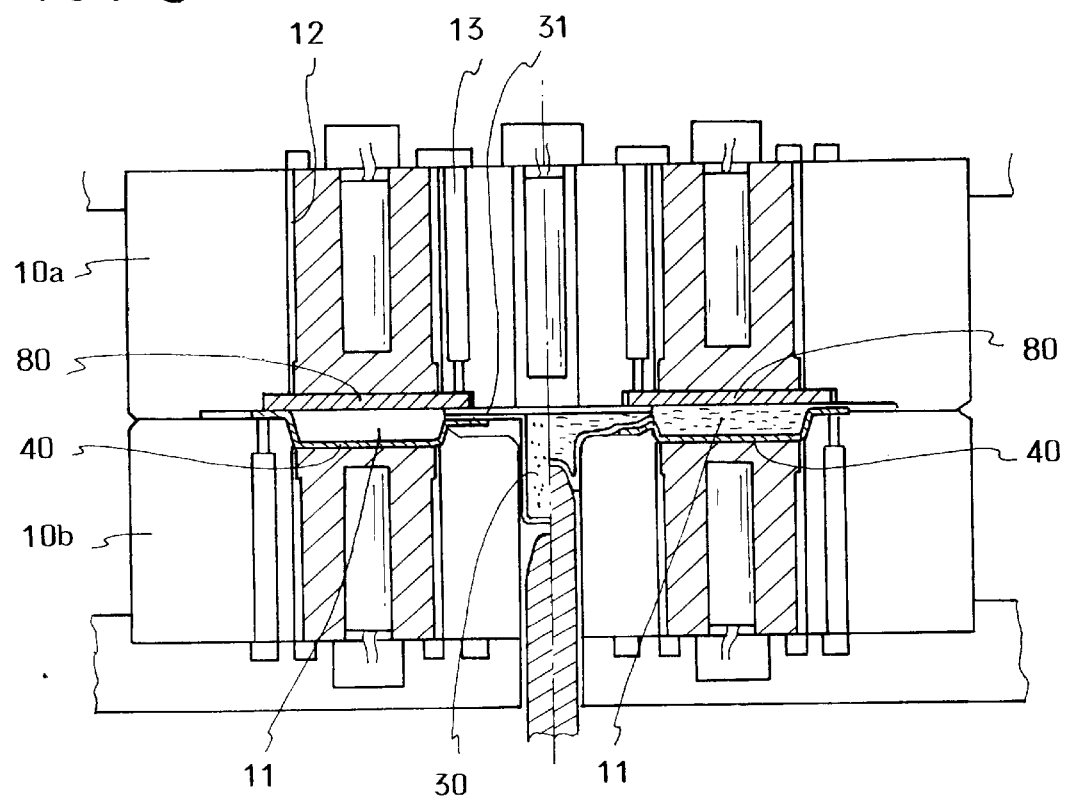
FIG. 19 is a sectional view of the molding machine of a Seventh Embodiment in which circuit boards are molded as an insert-member to be molded.

FIG. 19 shows the resin molding machine for molding one side of a substrate of BGA devices. In the Seventh Embodiment, the circuit substrate 80 is sucked and fixed to the upper die 10a, and the release film 40 is sucked and fixed to the lower die 10b. The resin is the wrapped resin 30. The wrapping film 31 is extended to the side edges of the cavities 11, so that the runners 17 and the gates 18 can be optionally arranged to connect side edges of the cavities 11 at any positions.

Figure 20:
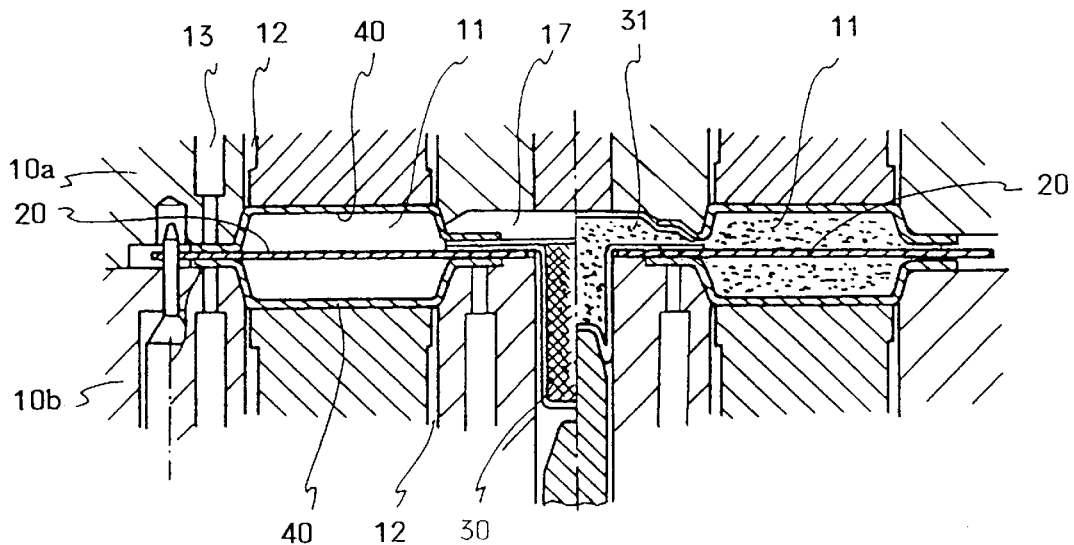
FIG. 20 is a sectional view showing the molding machine in which the gates are provided in an upper die.

Note that, in the forementioned embodiments, the gates 18 are formed in the lower die 10b but the gates 18 can be formed in the upper die 10a. The upper-gate type molding machine is shown in FIG. 20. The wrapping film 31 is extended between the gates 18 and the lead frames 20. And the gate film may be used instead of the wrapping film 31. In the upper-gate type molding machine too, the runners 17 and the gates 18 can be optionally arranged to connect side edges of the cavities 11 at any positions.

EIGHTH EMBODIMENT

Figure 21:
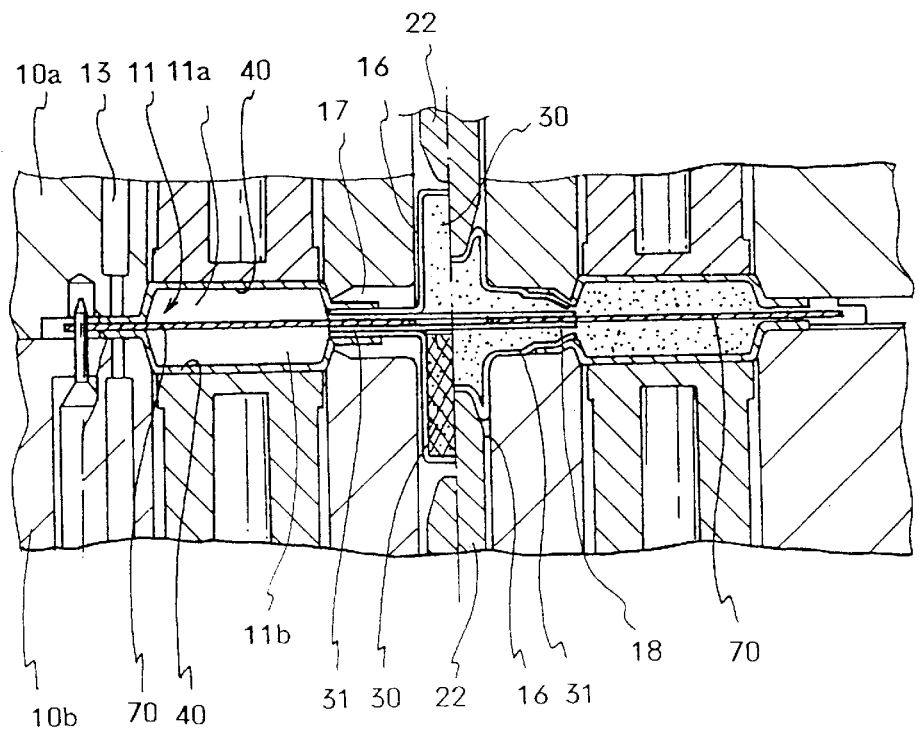
FIG. 21 is a sectional view of the molding machine of a Eighth Embodiment.
Figure 22:
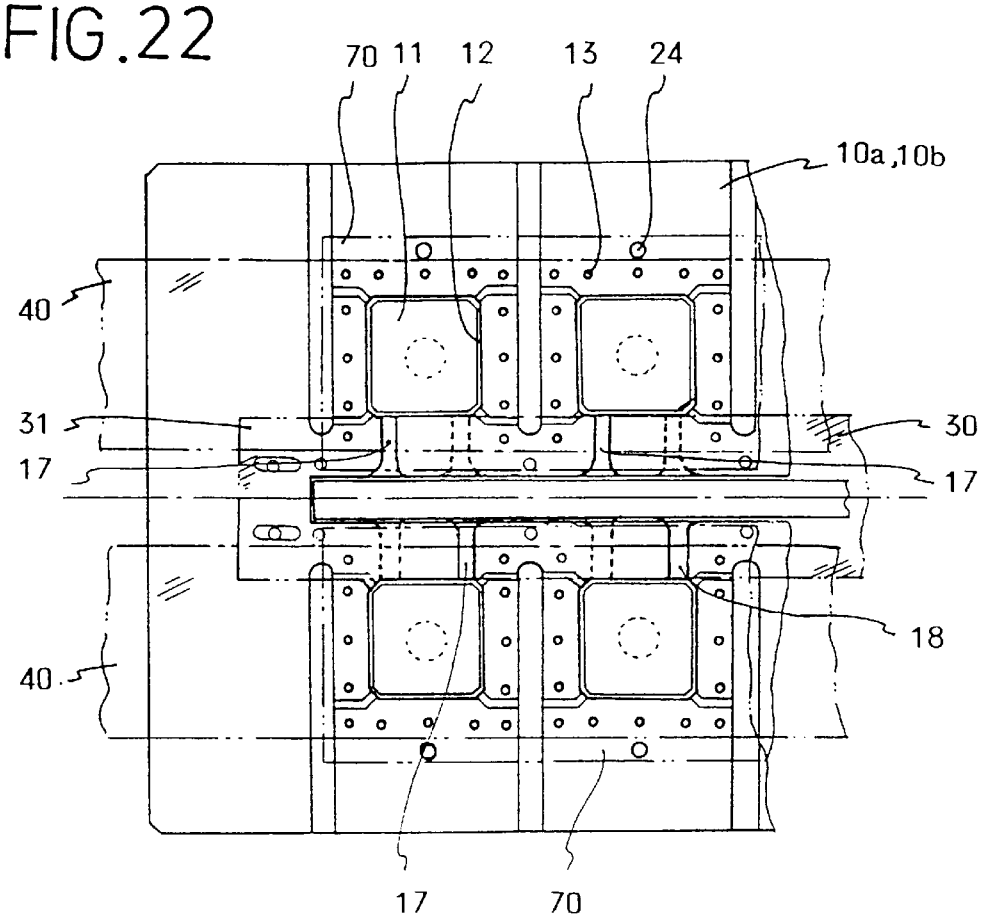
FIG. 22 is a plan view of the lower die of the molding machine of the Eighth Embodiment.
Figure 23:
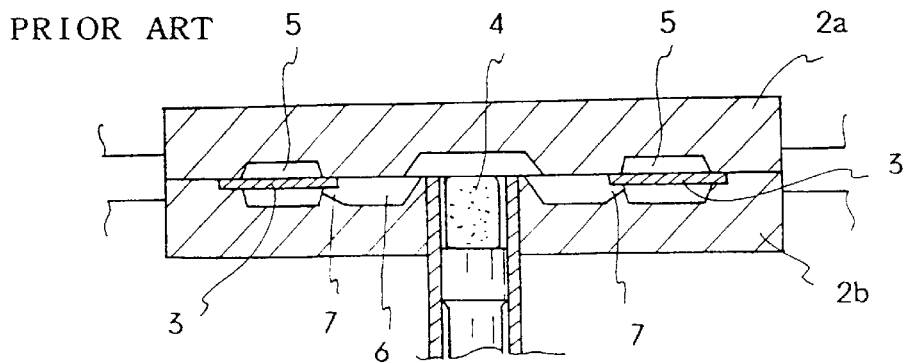
FIG. 23 is a partial sectional view of a conventional molding machine.

FIGS. 21 and 22 show the resin molding machine in which the runners 17 and the gates 18 are formed in the upper die 10a and the lower die 10b. The resin melt is filled in an upper cavity 11a and a lower cavity 11b, which are formed by dividing the cavity 11 with the insert-member 70. In the present embodiment, the pots 16 are formed in the upper die 10a and the lower die 10b. Two pieces of the wrapped resin 30 are respectively set in each pot 16. The resin paths in the dies 10a and 10b may be mutually faced. But their arrangements may be different in the dies 10a and 10b as shown in FIG. 22. In FIG. 22, the runners 17 and the gates 18 in the lower die 10b are shown by solid lines; the runners 17 and the gates 18 in the upper die 10a are shown by dotted lines.

Instead of forming the pots 16 in both dies 10a and 10b, one pot 16 may be formed in the upper die 10a or the lower die 10b. In this case, the pot 16 is connected to the upper cavities 11a and the lower cavities 11b by resin paths: upper gates and lower gates.

In the present embodiment too, surfaces of the insert-members 70 are covered with the wrapping film 31 or the gate film. With this structure, the runners 17 and the gates 18 can be optionally arranged to connect side edges of the upper cavity 11a and the lower cavity 11b at any position.

In the case of molding insert-members, e.g., TAB tape devices, wherein the upper cavity 11a is not well communicated with the lower cavity 11b, the resin molding machine of the present embodiment is advantageous to mold the members.

In the resin molding machine of the present invention, as we have described above, the runner 17 and the gate 18 can be optionally arranged to connect one or more side edges of each cavity 11 at any position. One or more edges of the film member(s), e.g., the wrapping film 31, the gate film 50, are set to coincide with one or more side edges of each cavity 11 to which the gate or gates 18 are connected. In some kinds of semiconductor devices, the arrangement of the gates 18 are limited by the arrangement of the outer leads. But, by using the film member, the arrangement of the gates 18 can be easily and optionally designed.

By connecting the wide gate or a plurality of the gates to each cavity, the resin melt can be efficiently filled into the cavities. The resin melt can be filled in the cavities in a short time without accelerating resin flow. Without accelerating the resin flow, forming voids in the resin can be prevented, so that reliability and quality of molded products can be improved.

The method and the molding machine of the present invention are preferable to mold semiconductor devices having thin package sections. Depth of the gate end connecting to the cavity is limited to about 50% of the thickness of the package section, so it will be shallow in said semiconductor devices. But, in the present invention, a plurality of the gates can be connected to all side edges of each cavity, so total sectional area of the gates can be greater. By increasing the total sectional area of the gates, molding efficiency can be improved even if the gates are shallow. In this case, a planar area of the gates will be greater, but the film member is provided to correspond to the gates so that gate-break can be executed without any problem, e.g., cracks in the thin package section. Further, the present invention can be applied to manufacturing many kinds of semiconductor devices: QFP, BGA, DIP, SIP, SOP, etc.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of molding upon an insert-member in a resin molding machine, the resin molding machine including an upper die and a lower die, a cavity in at least one of said upper die and said lower die, a pot in which resin is introduced, and a resin path which allows the resin to flow from said pot into said cavity and onto said insert-member set in said dies, said method comprising the steps of:
setting a film member between a parting face of said die, in which said resin path is formed, and said insert-member so as to cover a part of said insert-member corresponding to said resin path, wherein an edge of said film member coincides with at least one of said edges of said cavity;
clamping said insert-member by said dies together with said film member; and
filling said resin into said cavity via said resin path.

2. The method according to claim 1, wherein the resin path connecting said pot with said cavity includes a route formed in said upper die and a route formed in said lower die.

3. The method according to claim 1, wherein said resin introduced in said pot is tightly wrapped with wrapping film, and wherein an edge of said wrapping film is extended from said pot to at least one of the side edges of said cavity, the extended part of said wrapping film is provided between said parting face and said insert-member to act as said film member.

4. The method according to claim 3, wherein said pot is formed into a long pot, and wherein said resin wrapped with wrapping film is formed into a long stick corresponding to the shape of said long pot.

5. The method according to claim 1, wherein said film member is gate film, which covers over an opening section of said pot and which is extended until at least one of the side edges of said cavity.

6. The method according to claim 5, wherein said gate film is extended until the side edge of said cavity, which is closest to said pot.

7. The method according to claim 5, wherein said gate film is extended until all of the side edges of said cavity, and wherein said cavity is not covered with said gate film.

8. The method according to claim 1, wherein an inner face of said cavity is covered with release film, which is fixed on the inner face thereof by air suction.

9. A resin molding machine, comprising:

an upper die and a lower die for clamping an insert-member to be molded upon, said dies having a pot, a resin path and a cavity, wherein resin in the pot is introduced into the cavity via the resin path, and the resin flows upon the insert-member set in said dies; and a film feeder for feeding a film member between a parting face of said die, in which the resin path is formed, and the insert-member so as to cover a part of the insert-member corresponding to the resin path, said film feeder positioning an edge of the film member to coincide with at least one of side edges of said cavity, wherein an end of a gate of the resin path is connected with the at least one side edge of the cavity.

10. The resin molding machine according to claim 9, wherein the resin path connecting said pot with said cavity includes a route formed in said upper die and a route formed in said lower die.

11. The resin molding machine according to claim 9, further comprising a resin supplier for supplying the resin, the resin being tightly wrapped with wrapping film, wherein an edge of the wrapping film is extended from the pot to at least one of the side edges of the cavity.

12. The resin molding machine according to claim 9, wherein said film feeder feeds gate film to cover over an opening section of the pot and to extend until at least one of the side edges of the cavity.

13. The resin molding machine according to claim 9, wherein the pot is formed into a long pot, and wherein a plurality of the cavities are provided on both sides of the long pot.

14. The resin molding machine according to claim 9, wherein the resin path includes a plurality of routes connecting the pot with the cavity.

15. The resin molding machine according to claim 9, wherein a width of an end of the resin path connecting to the cavity is equal to a length of the side edge of the cavity.

16. The resin molding machine according to claim 9, further comprising a fixing mechanism for covering and fixing a release film on an inner face of the cavity by air suction.

17. A resin molding machine, comprising:

an upper die and a lower die for clamping an insert-member to be molded upon;

a plurality of rectangular cavities formed within one of said upper and lower dies, said plurality of rectangular cavities being arranged such that one edge of each of said plurality of cavities is linearly aligned with one edge of each of the other of said plurality of rectangular cavities;

at least one pot formed within said one of said upper and lower dies;

a plurality of resin paths fluidly communicating said at least one pot to each of said plurality of rectangular cavities, each resin path of said plurality of resin paths fluidly communicating with a respective rectangular cavity along the edge of the respective cavity which is linearly aligned with the other edges of the other cavities; and a release film covering said plurality of resin paths, said release film having a linear edge which is substantially linearly aligned with the linearly aligned edges of said plurality of rectangular cavities.

18. The resin molding machine according to claim 17, further comprising:

wrapped resin contained in said at least one pot, a wrapping of said wrapped resin including said release film.

19. The resin molding machine according to claim 18, wherein said release film is a first release film, said wrapping of said wrapped resin further including a second release film which overlays said first release film and which includes an edge which is substantially linearly aligned with the linearly aligned edges of said plurality of rectangular cavities, and said plurality of resin paths are defined between said first release film and said second release film.

20. The resin molding machine according to claim 19, further comprising:

a plurality of communication ports, each communication port being formed between a respective resin path and a respective rectangular cavity, each communication port extending over substantially an entire length of the edge of the respective cavity which is linearly aligned with the other edges of the other cavities.

* * * * *